US008461870B2

(12) United States Patent
Hioki

(10) Patent No.: US 8,461,870 B2
(45) Date of Patent: Jun. 11, 2013

(54) NON-VOLATILE MULTIPLEXER-TYPE PROGRAMMABLE ROUTING SWITCH

(75) Inventor: Masakazu Hioki, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/126,506

(22) PCT Filed: Oct. 26, 2009

(86) PCT No.: PCT/JP2009/068347
§ 371 (c)(1),
(2), (4) Date: Apr. 28, 2011

(87) PCT Pub. No.: WO2010/050440
PCT Pub. Date: May 6, 2010

(65) Prior Publication Data
US 2011/0273205 A1 Nov. 10, 2011

(30) Foreign Application Priority Data
Oct. 30, 2008 (JP) ................................. 2008-279573

(51) Int. Cl.
*H03K 19/177* (2006.01)
(52) U.S. Cl.
USPC .................. 326/41; 326/113; 326/38; 326/47
(58) Field of Classification Search
USPC ........................ 326/37–41, 47, 113
See application file for complete search history.

(56) References Cited

U.S. PATENT DOCUMENTS

| 5,633,518 | A | 5/1997 | Broze | |
|---|---|---|---|---|
| 5,764,096 | A | 6/1998 | Lipp et al. | |
| 5,773,862 | A | 6/1998 | Peng et al. | |
| 5,838,040 | A | 11/1998 | Salter, III et al. | |
| 5,894,148 | A | 4/1999 | Peng et al. | |
| 6,252,273 | B1 | 6/2001 | Salter, III et al. | |
| 6,285,575 | B1 | 9/2001 | Miwa | |
| 6,781,865 | B2 * | 8/2004 | Ohtsuka et al. | 365/145 |
| 7,463,061 | B1 * | 12/2008 | Greene et al. | 326/41 |
| 7,816,947 | B1 * | 10/2010 | Wang | 326/50 |
| 2004/0164778 | A1 | 8/2004 | Toyoda et al. | |
| 2008/0100336 | A1 * | 5/2008 | Hutchings et al. | 326/38 |

FOREIGN PATENT DOCUMENTS

| JP | 2000-124776 | 4/2000 |
|---|---|---|
| JP | 2000-323671 | 11/2000 |
| JP | 2001-283584 | 10/2001 |
| JP | 2003-115754 | 4/2003 |

* cited by examiner

*Primary Examiner* — Jany Richardson
(74) *Attorney, Agent, or Firm* — Bacon & Thomas, PLLC

(57) ABSTRACT

A reconfigurable integrated circuit has non-volatile storage cells which form a plurality of programmable routing switches between basic tiles. The circuit includes a plurality of non-volatile storage cells providing a multiplexer-type programmable routing switch including a plurality of input terminals and an output terminal. The non-volatile storage cells are structured as a field effect transistor with a switch function and are placed in a propagation path of signal voltage from the input terminals to the output terminal, and the non-volatile storage cells configure the multiplexer-type programmable routing switch to selectively propagate the signal voltage from the input terminals, to provide a control circuit which directly writes conducted or non-conducted status for the non-volatile storage cells, erases the connection information, and reads to verify the conducted or non-conducted status of the non-volatile storage cells.

3 Claims, 3 Drawing Sheets

NON-VOLATILE MULTIPLEXER-TYPE PROGRAMMABLE ROUTING SWITCH

TECHNICAL FIELD

The present invention relates to a reconfigurable integrated circuit configured by a semiconductor integrated circuit, and particularly, to a reconfigurable integrated circuit in which non-volatile storage cells configure a plurality of programmable routing switches to set up a wiring status between basic tiles of basic circuit elements.

BACKGROUND ART

A reconfigurable integrated circuit, represented by FPGA (Field Programmable Gate Array) that is able to alter its circuit configuration arbitrarily, is a device which stores circuit configuration information in a storage cell built in the device to allow for freely and flexibly altering its connection status of routing wires, logic functions in logic blocks, or interconnection status between the routing wire and the logic block. A user can configure a logic circuit with desirable scale and functions by externally writing the circuit configuration information in the storage cell within the device.

In order to implement a flexible reconfiguration function in the reconfigurable integrated circuit, a plurality of programmable routing switches are implemented in a plurality of basic circuit blocks as well as a plurality of routing switch blocks to control the connection status between the basic circuit blocks.

The programmable routing switch is configured by a field effect transistor with a switch function (switch FET) and a storage cell for storing a conducted or non-conducted status of the switch FET.

By connecting the wires between the routing wires or between the routing wire and the logic block via the programmable routing switch, a connected or disconnected status between the routing wires or between the routing wire and the logic block can be determined by a stored status of the storage cell built in the programmable routing switch.

The programmable routing switch has a plurality of input terminals and a single output terminal, and also has a plurality of switch FETs that configure a multiplexer circuit capable of selectively outputting signal voltage from the plurality of input terminals, and a plurality of storage cells for storing the conducted or non-conducted status of the switch FETs that configure the multiplexer circuit. These storage cells employ SRAM (Static Random Access Memory).

Patent Documents 1-6 have proposed the programmable routing switch using the non-volatile storage cells as information storage cells for the purpose of anti-tapping of configuration information of the FPGA or reduction in the power consumption of the programmable routing switch, particularly the storage cells.

For example, the programmable routing switches provided with the non-volatile storage cells, as described in Patent Document 1 or 2, employs a configuration in which the switch FET shares a floating gate with a device having functions of tunneling electrons and of verifying an accumulated charge amount of the floating gate, and two FETs configure a single basic device.

In addition, the programmable routing switch provided with the non-volatile storage cells, as described in Patent Document 3, 4, 5, or 6 employs a configuration in which the switch FET shares a floating gate with a device having a function of tunneling electrons and a device having a function of verifying an accumulated charge amount of the floating gate, and three FETs configure a single basic device.

Patent Document 1: U.S. Pat. No. 5,838,040
Patent Document 2: U.S. Pat. No. 5,633,518
Patent Document 3: U.S. Pat. No. 5,773,862,
Patent Document 4: U.S. Pat. No. 5,894,148
Patent Document 5: U.S. Pat. No. 5,764,096
Patent Document 6: U.S. Pat. No. 6,252,273

DISCLOSURE OF THE INVENTION

Problems to be Solved by the Invention

The programmable routing switch provided with the non-volatile storage cells, as described in Patent Document 1 or 2, has a problem that a switch area increases because a single basic device is configured by two FETs.

The programmable routing switch provided with the non-volatile storage cells, as described in Patent Document 3, 4, 5, or 6, also has a problem that a switch area increases because a single basic device is configured by three FETs.

Moreover, the programmable routing switch having the non-volatile storage cells, as described in Patent Documents 1-6, has a problem that it does not support a multiplexer-type programmable routing switch which has become mainstream in the FPGA field in recent years.

The present invention has been made to address the above-mentioned problems, and an object thereof is to provide a reconfigurable integrated circuit in which non-volatile storage cells configure a plurality of programmable routing switches to set up a connection status between basic tiles as basic circuit elements.

Means for Solving the Problems

In order to achieve the above-mentioned object, a reconfigurable integrated circuit according to the present invention, as a basic configuration, comprises a plurality of non-volatile storage cells that configure a multiplexer-type programmable routing switch including a plurality of input terminals and an output terminal, wherein: the non-volatile storage cells having a structure of a field effect transistor with a switch function are placed in a propagation path of signal voltage from the input terminals to the output terminal, so that the non-volatile storage cells configure the multiplexer-type programmable routing switch to selectively propagate the signal voltage from the input terminals to the output terminal, and control signal lines are provided for storing connection information to set the non-volatile storage cells to a conducted or non-conducted status.

The reconfigurable integrated circuit according to the present invention comprises a control circuit to perform write operation to store the connection information to set the conducted or non-conducted status, erase operation to erase the connection information, and read operation to verify the conducted or non-conducted status of the non-volatile storage cells directly for the non-volatile storage cells arranged in multiple stages to configure the multiplexer-type programmable routing switch.

An aspect of the reconfigurable integrated circuit according to the present invention having a structure in which a plurality of basic tiles as basic circuit elements are arranged in arrays, the basic tile being configured by routing wires to connect between the basic tiles, a switch matrix to connect between the routing wires, and a functional block connected to the switch matrix, comprises; a multiplexer-type programmable routing switch configured by non-volatile storage cells having a structure of a field effect transistor arranged in multiple stages having a switch function in the switch matrices; and control signal lines and control circuits for performing write operation to store connection information to set a conducted or non-conducted status in each stage configuring the multiplexer-type programmable routing switch, verify read operation to read the connection information, and erase operation to erase the connection information for the non-volatile storage cells.

Another aspect of the reconfigurable integrated circuit according to the present invention having a structure in which a plurality of basic tiles as basic circuit elements are arranged in arrays, the basic tile being configured by routing wires to connect between the basic tiles, a switch matrix to connect between the routing wires, and a functional block connected to the switch matrix, comprises: a multiplexer-type programmable routing switch configured by non-volatile storage cells having a structure of a field effect transistor arranged in multiple stages having a switch function in the functional blocks; and control signal lines and control circuits for performing write operation to store connection information to set a conducted or non-conducted status in each stage configuring the multiplexer-type programmable routing switch, verify read operation to read the connection information, and erase operation to erase the connection information for the non-volatile storage cells configuring the multiplexer-type programmable routing switch.

In this case, the reconfigurable integrated circuit according the present invention collectively performs the erase operation for the non-volatile storage cells by selecting all of the non-volatile storage cells configuring the programmable routing switch.

Effects of the Invention

In contrast to the conventional programmable routing switch comprising non-volatile storage cells which requires three types of devices, i.e., a switch FET, a verify read FET, and a device for write and erase operations, or two types of FETs, i.e., a switch FET, and an FET for write, erase, and verify read operations, the programmable routing switch according to the present invention can perform all functions of the switch FET, as well as write, erase, and verify read operations by means of a single non-volatile storage cell having a structure of a field effect transistor, so that an area of the programmable routing switch can be decreased.

The reconfigurable integrated circuit comprising non-volatile storage cells that configures a multiplexer-type programmable routing switch according to the present invention can perform the erase, write, and verify read operations directly for the non-volatile storage cells configuring the programmable routing switch. In addition, since the non-volatile storage cell has a function as the programmable routing switch, an occupied area can be decreased as compared to that of the reconfigurable integrated circuit having the conventional non-volatile storage devices.

BEST MODES FOR CARRYING OUT THE INVENTION

Figure 1:
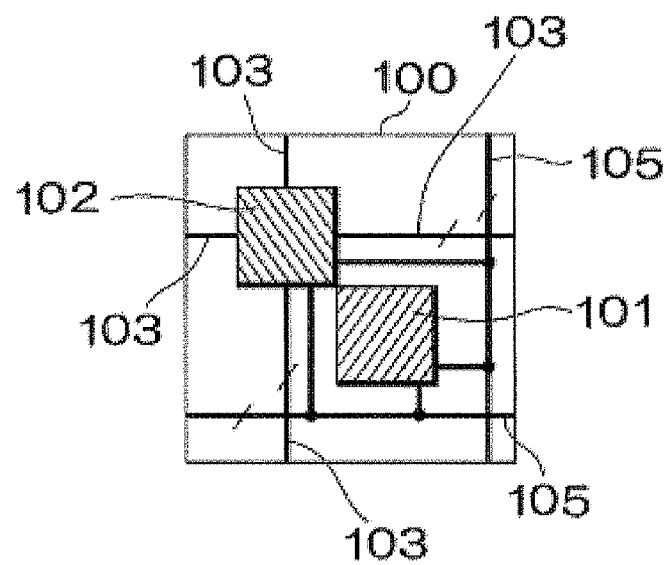
FIG. 1 illustrates a structure of a basic tile as a basic circuit element to configure a reconfigurable integrated circuit according to the present invention.

Hereinbelow, an embodiment of the present invention will be described with reference to the figures. FIG. 1 illustrates a structure of a basic tile as a basic circuit element to configure a reconfigurable integrated circuit according to the present invention. A basic tile 100 includes a functional block 101, a switch matrix 102, routing wires 103, and control signal lines 105 for non-volatile storage cells that configure a programmable routing switch. The functional block 101 is configured as a logic block in which a logic function can be externally rewritten or I/O block. While the non-volatile storage cells that configure the programmable routing switch are built in the switch matrix 102, the programmable routing switch may be built in as a part of the functional block 101.

The switch matrix 102 includes a plurality of programmable routing switches built therein. Although not shown, the functional block 101 and the switch matrix 102 are interconnected via wire. Depending on a conducted or non-conducted status of the programmable routing switch within the switch matrix 102, a voltage signal is propagated between the routing wires 103 or from the routing wire 103 to the functional block 101, or otherwise the voltage signal processed in the functional block 101 is propagated to the routing wire 103.

For a plurality of non-volatile storage cells that configure the programmable routing switch built in the switch matrix 102 and the functional block 101, write, erase, or verify read operation is performed via the control signal lines 105 in order to set up the conducted or non-conducted status of the non-volatile storage cells.

Figure 2:
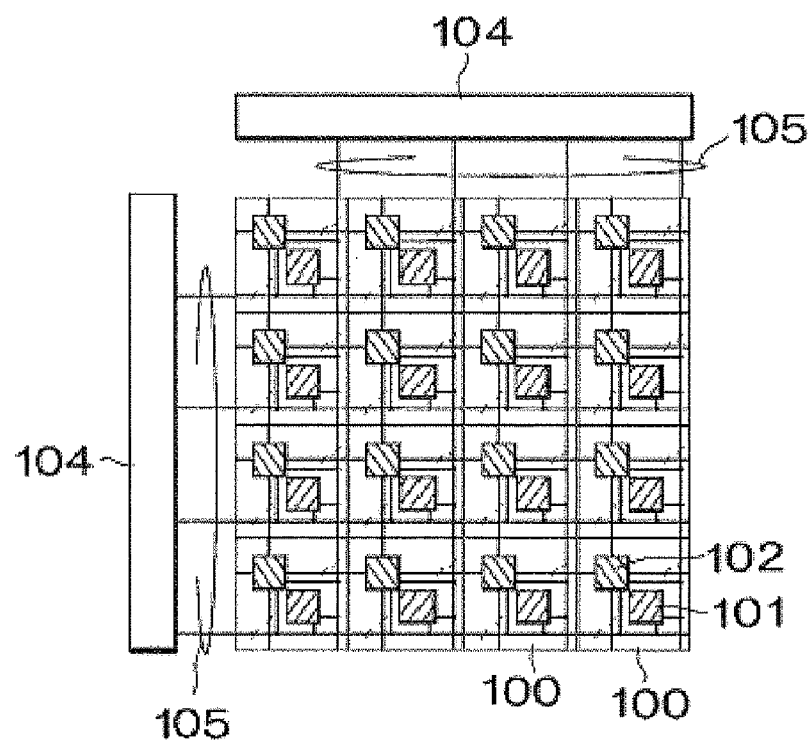
FIG. 2 illustrates an overall configuration of the reconfigurable integrated circuit according to the present invention.

FIG. 2 illustrates an overall configuration of the reconfigurable integrated circuit according to the present invention. The reconfigurable integrated circuit of the present invention is structured by the basic tiles 100 arranged in arrays. The control signal lines 105 for controlling the non-volatile storage cells are connected to control circuits 104.

The control circuit 104 is provided with a write circuit, an erase circuit, and a verify read circuit for setting up the conducted or non-conducted status of the non-volatile storage cells that configure the programmable routing switch. The control circuit 104 typically employs a conventionally publicly known control circuit that controls writing to or reading from the non-volatile storage cells that configure a non-volatile storage device. The configuration of such a control circuit is publicly known and thus the detailed description thereof is omitted herein.

The control circuit 104 is configured to control all of the non-volatile storage cells of the reconfigurable integrated circuit. Alternatively, it may be configured in such a manner that multiple sets of non-volatile storage cells are formed for a predetermined number of sections of basic tiles and the control circuit is provided for each set of the non-volatile storage cells to control the sets individually.

Figure 3:
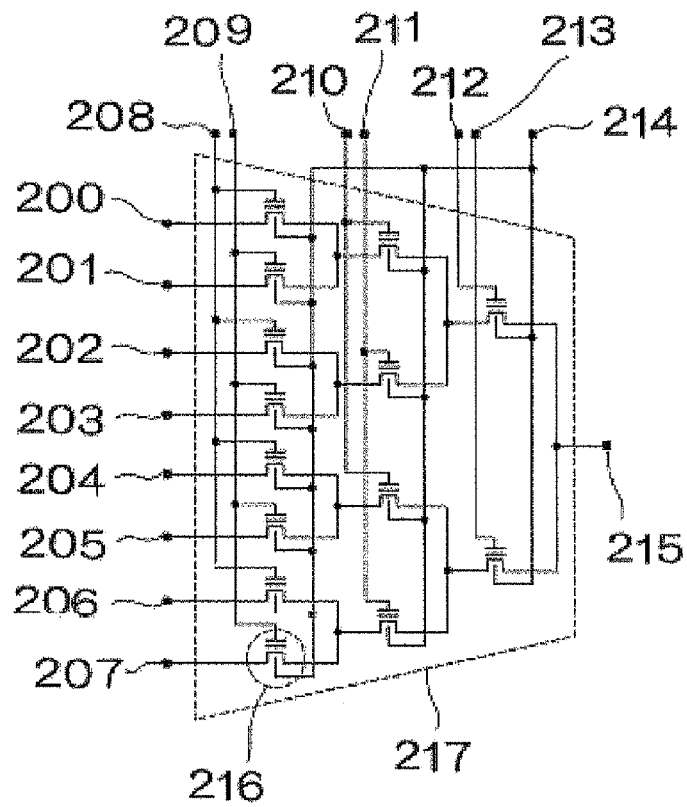
FIG. 3 illustrates a configuration of a multiplexer-type programmable routing switch of the reconfigurable integrated circuit according to the present invention.
Figure 4:
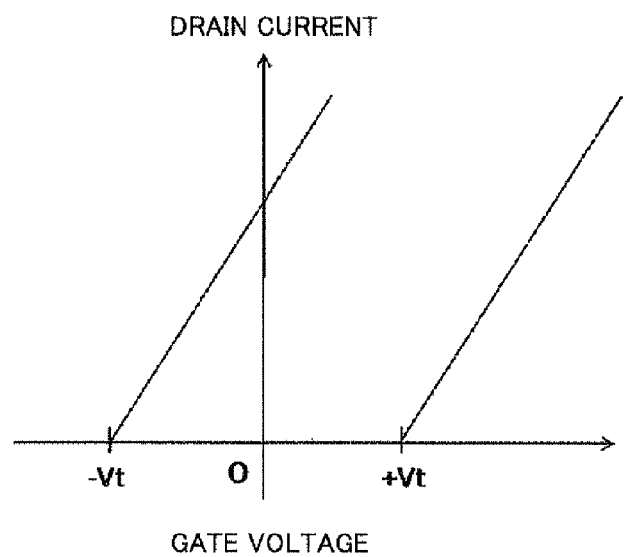
FIG. 4 illustrates drain current-control gate voltage characteristics of non-volatile storage cells that configure the programmable routing switch used in the reconfigurable integrated circuit according to the present invention.

FIG. 3 illustrates a configuration of a multiplexer-type programmable routing switch of the reconfigurable integrated circuit according to the present invention, and FIG. 4 illustrates drain current-control gate voltage characteristics of the non-volatile storage cells that configure the programmable routing switch used in the reconfigurable integrated circuit according to the present invention. The description will be made with reference to these figures.

As shown in FIG. 3, a programmable routing switch 217 has a switch structure arranged so that a plurality of non-volatile storage cells 216 configure a multiplexer-type switch circuit. The respective non-volatile storage cells 216 that configure the programmable routing switch employ flash memory cell-type non-volatile storage cells. This flash memory cell-type non-volatile storage cell has a floating gate structure which, by tunneling electrons from the floating gate or to the floating gate, sets up a positive threshold voltage +Vt and a negative threshold voltage −Vt corresponding to a charge amount accumulated in the floating gate, as shown in FIG. 4, to control the conducted or non-conducted status. Such characteristics are well known for the flash memory cell-type non-volatile storage cells.

The non-volatile storage cells 216 that configure the multiplexer-type programmable routing switch 217 in this example may employ any type of transistor structures as long as they are the non-volatile storage cells capable of selectively writing the positive and negative threshold voltages through a control terminal.

The multiplexer-type programmable routing switch 217 includes a plurality of signal input terminals 200-207, a single signal output terminal 215, a plurality of non-volatile storage cells 216, and a plurality of control terminals 208-214 to input control signals for controlling the conducted or non-conducted status of the plurality of non-volatile storage cells 216, and is structured so that the plurality of non-volatile storage cells 216 are connected in multiple stages in the direction from the input terminals to the output terminal.

The programmable routing switch 217 forms a propagation path of a signal to be output to the single signal output terminal 215 by its switch function when one of the voltage signals input to the plurality of signal input terminals 200-207 is selected. This propagation path of the selected signal is set up by means of circuit information stored in each non-volatile storage cell 216 as a switch function element.

In the programmable routing switch 217, the non-volatile storage cells 216 with the switch function are arranged in multiple stages of a binary tree structure in the signal propagation path from the signal input terminals 200-207 to the signal output terminal 215. Each stage is provided with two control terminals (208-209, 210-211, 212-213), one of which is commonly connected with each control gate of one of the child non-volatile storage cells 216 in each stage while the other is commonly connected with the control gates of the other non-volatile storage cells 216.

In addition, substrate domains (substrate terminals) of all of the non-volatile storage cells 216 are commonly connected to the control terminal 214. The conducted or non-conducted status of the non-volatile storage cells placed in the signal path is set up by inputting an appropriate control signal to the control terminals 208-213 connected to the control gates of the non-volatile storage cells 216, and a signal path is set up so that an input signal from any of the signal input terminals 200-207 is selectively output to the signal output terminal 215. This signal path is set up by means of information stored in each non-volatile storage cell 216.

Next, erase, write, verify read, and programmable wiring operations for storing information to set up the signal path in the non-volatile storage cells 216 will be specifically described in that order. The erase operation is performed first, followed by the write operation, and then a written content is read by the verify read operation.

The erase operation will be described. In the erase operation, the signal input terminals 200-207 and the signal output terminal 215 are set to a floating state, and the control terminals 208-213 are set to 0 V. By applying positive high voltage, an erase voltage +Vera, to the control terminal 214, the electrons are tunneled from the floating gates of all of the non-volatile storage cells 216 to the substrate, and the threshold voltage of all of the non-volatile storage cells 216 switches to the negative threshold voltage −Vt. Thereby, the erase operation is completed.

Next, the write operation will be described. The write operation is performed after the completion of the erase operation. The write operation is performed sequentially in each stage of the non-volatile storage cells 216 configuring the binary tree structure. Since each stage is provided with two control terminals, the write operation is performed individually for the plurality of non-volatile storage cells 216 connected to the respective control terminals of each stage. In a certain stage, if the negative voltage −Vt is written as the threshold voltage in the plurality of non-volatile storage cells 216 connected to one control terminal (208 or 209), the positive voltage +Vt would be written as the threshold voltage in the plurality of non-volatile storage cells 216 connected to the other control terminal (209 or 208). This operation is performed sequentially from the stage closest to the signal input terminals 200-207 in the direction toward the output signal terminal 215.

The specific description is as follows. The signal input terminals 200-207 are set to the floating state, and the control terminal 214 is set to 0 V. The control terminal (208 or 209) commonly connected with the control gates of the non-volatile storage cells 216 selected as a write target in the stage selected for writing is applied with positive high voltage, a write voltage +Vpgm, while the control terminal (209 or 208) commonly connected with the control gates of the non-volatile storage cells 216 not selected as a write target in the stage for writing is applied with 0 V. The control terminals (210-213) commonly connected with the control gates of all of the non-volatile storage cells 216 in the stage not selected for writing are applied with a positive voltage +Vpass.

If the positive threshold voltage +Vt is written in the non-volatile storage cells 216 selected as a write target in the stage selected for writing, the signal output terminal 215 is set to 0 V. Since the positive voltage +Vpass is applied to the control terminals (210-213), 0 V applied to the signal output terminal 215 is transferred to the non-volatile storage cells 216 selected as a write target in the stage selected for writing via the non-volatile storage cells 216 in the stage not selected for writing. Thereby, the electrons are tunneled from the substrate of the non-volatile storage cell 216 selected as a write target in the stage selected for writing to the floating gate, and as a result, the threshold voltage switches to the positive voltage +Vt of the non-volatile storage cells 216 selected as a write target in the stage selected for writing.

If the negative threshold voltage −Vt is written in the non-volatile storage cells 216 selected as a write target in the stage selected for writing, a write inhibit voltage +Viht is applied to the signal output terminal 215. This voltage +Viht applied to the signal output terminal 215 is transferred to the non-volatile storage cell 216 selected as a write target in the stage selected for writing via the non-volatile storage cells 216 in the stage not selected for writing. Thereby, tunneling of the electrons from the substrate of the non-volatile storage cells 216 selected as a write target in the stage selected for writing to the floating gate is prohibited, and as a result, the threshold voltage of the non-volatile storage cells 216 selected as a write target in the stage selected for writing is maintained to be the negative voltage −Vt.

In this case, the positive voltage +Vpass applied to the control terminals (210-213) commonly connected to the control gates of all of the non-volatile storage cells 216 in the stage not selected for writing has a value sufficient for the write inhibit voltage +Viht applied to the signal output terminal 215 to be transferred to the non-volatile storage cells 216 selected as a write target in the stage selected for writing without voltage attenuation, and sufficient for the non-volatile storage cells 216 having the positive threshold voltage +Vt to be set to the conducted status.

Next, the verify read operation will be described. In the verify read operation, two control terminals connected to all of the non-volatile storage cells 216 in the stage selected for reading are set to 0 V. The control terminal 214 is set to 0 V. The control terminal commonly connected with the control gates of all of the non-volatile storage cells 216 in the stage not selected for reading is applied with the positive voltage +Vpass. The signal output terminal 215 is applied with a read voltage +Vread. One of the signal input terminals electrically conducted with the non-volatile storage cells 216 selected as a read target in the stage selected for reading is set to 0 V, while the other signal input terminals are set to the floating state.

In this state, it is determined whether the non-volatile storage cells 216 selected as a read target in the stage selected for reading are in the conducted or non-conducted status, and it is verified whether a desired threshold voltage (+Vt or −Vt) has been written in the non-volatile storage cells 216 selected as a read target in the stage selected for reading for all of the non-volatile storage cells 216 configuring the programmable routing switch 217. If there are a plurality of signal input terminals that are electrically conducted to the non-volatile storage cells 216 selected as a read target in the stage selected for reading, either all or only one of them may be set to 0 V.

Next, the operation of the programmable routing switch will be described. The programmable routing switch forms the propagation path to propagate electric signals through the routing wires in the vertical and horizontal directions depending on the status stored in the non-volatile storage cells configuring the programmable routing switch. In the operation, the control terminals 208-214 are first set to 0 V. In this state, signals are input from the signal input terminals 200-207. Since, in the programmable routing switch 217 in a binary tree structure, one non-volatile storage cell 216 has the positive threshold voltage +Vt in a certain stage and the other non-volatile storage cell 216 has the negative threshold voltage, either of them is in the conducted status and the other in the non-conducted status. Thereby, the signal propagation path is formed for propagating the voltage signal from any one of the signal input terminals 200-207 to the signal output terminal 215, so that the input signal is output to the signal output terminal 215.

Figure 5:
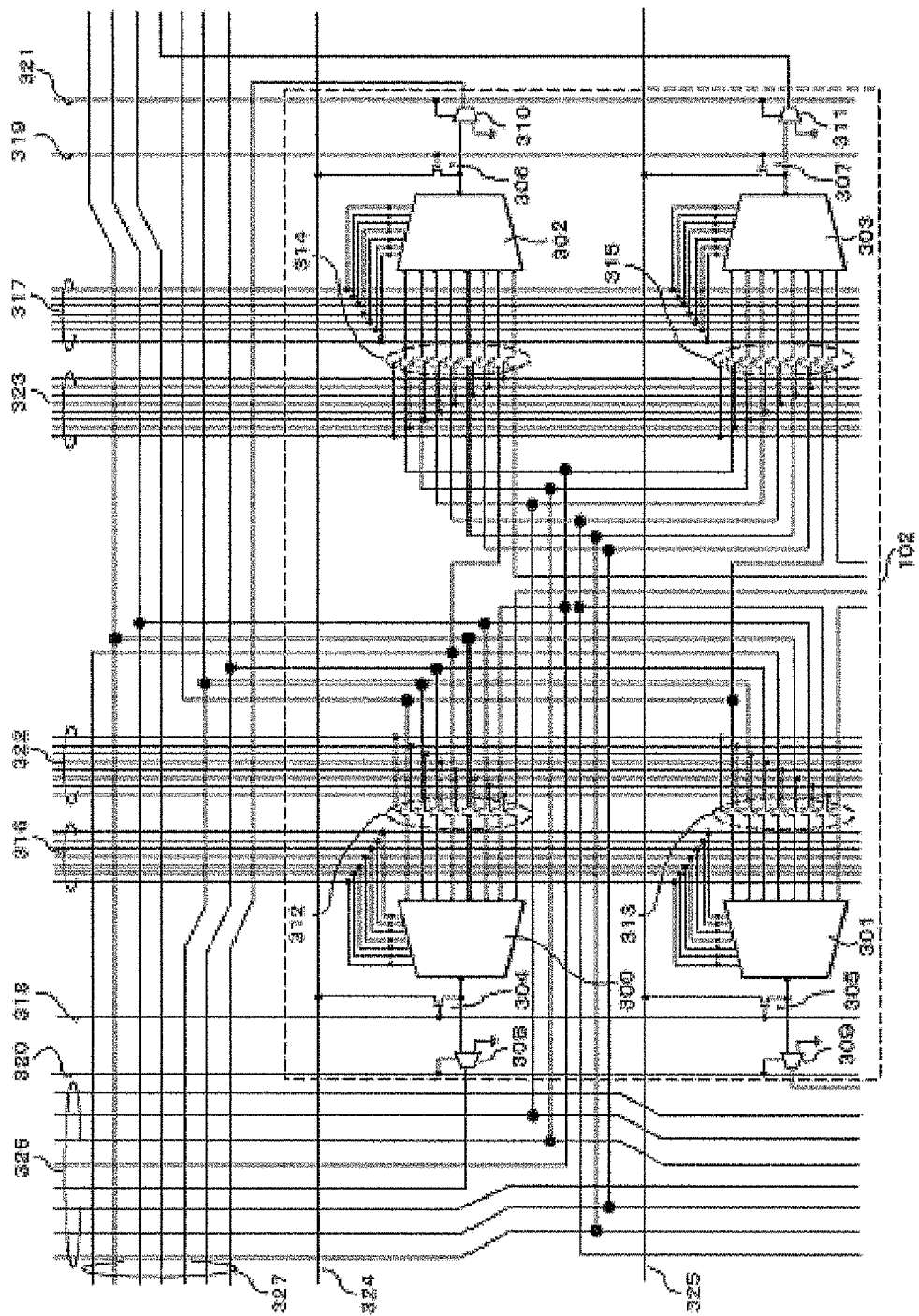
FIG. 5 illustrates an example of the programmable routing switch applied to a switch matrix in the reconfigurable integrated circuit according to the present invention.

FIG. 5 illustrates an example of the programmable routing switch 217 applied to the switch matrix 102 in the reconfigurable integrated circuit according to the present invention.

With reference to FIG. 5, the switch matrix 102 that provides a signal propagation function between routing wires 326 and 327 is provided with multiplexer-type programmable routing switches 300-303 as described with reference to FIG. 3, as well as control signal lines 316-323 for controlling these programmable routing switches 300-303. In connection to the control thereof, switch field effect transistors 304-307, 312-315 and multiplexer circuits 308-310 are provided.

Control terminals of the programmable routing switches 300 and 301 are commonly connected to control signal lines 316, while the signal input terminals of the programmable routing switches 300 and 301 are commonly connected with the signal lines from routing wires 326, 327 via the switch field effect transistors 312, 313 controlled by control signal lines 322.

In addition, the control terminals of the programmable routing switches 302 and 303 are commonly connected to the control signal lines 317, while the signal input terminals of the programmable routing switches 302 and 303 are commonly connected with the signal line from the routing wires 326, 327 via the switch field effect transistors 314, 315 controlled by control signal lines 323.

The signal input terminals of the programmable routing switches 300-303 are connected with the switch field effect transistors (hereinbelow, abbreviated as the switch FETs) 312-315, respectively. Each gate of the switch FETs 312 and 313 is commonly connected to the control signal lines 322, while each gate of the switch FETs 314 and 315 is commonly connected to the control signal lines 323.

The signal output terminals of the programmable routing switches 300 and 302 are connected with the switch FETs 304 and 306, respectively, and through which commonly connected to the control signal line 324. The signal output terminals of the programmable routing switches 301 and 303 are connected with the switch FETs 305 and 307, respectively, and through which commonly connected to the control signal line 325.

The signal output terminals of the programmable routing switches 300 and 302 are connected to one of the input terminals of the multiplexer circuits 308 and 310, respectively. The signal output terminals of the programmable routing switches 301 and 303 are connected to one of the input terminals of multiplexer circuits 309 and 311, respectively. The other input terminals of the multiplexer circuits 308-311 are grounded to 0 V. The control terminals of the multiplexer circuits 308 and 309 are commonly connected to the control signal line 320, so that the output signal from the programmable routing switches 300 and 301 or 0 V is selectively output to the routing wires 326 by a signal from the control signal line 320.

In addition, the multiplexer circuits 310 and 311 are commonly connected to the control signal line 321, so that the output signal from the programmable routing switches 302 and 303 or 0 V is selectively output to the routing wires 327 by a signal from the control signal line 321.

The control signal lines 316-325, connected to a control circuit similar to the control circuit 104 described with reference to FIG. 2, propagate an appropriate signal to the programmable routing switch in each programmable routing switch operation in order to perform the erase, write, and verify read operations.

Next, the erase, write, verify read, and programmable routing switch operations will be described.

First, the erase operation will be described. In the erase operation, the control terminals 316 and 317 connected to the control gates of the non-volatile storage cells configuring the programmable routing switches 300-303 are applied with 0 V. The switch FETs 312-315 are set to the non-conducted status by setting the control terminals 322 and 323 to 0 V, and as a result, the signal input terminals of the programmable routing switches 300-303 are set to the floating state.

The control signal lines 318 and 319 are applied with 0 V, while the control signal lines 320 and 321 are applied with the signal for selecting the multiplexer circuits 308-311 to output 0 V. Thereby, the signal output terminals of the programmable routing switches 300-303 are set to the floating state. In this state, the control signal line (not shown) connected to the substrate of the non-volatile storage cells configuring the programmable routing switches 300-303 is applied with the positive high voltage, the erase voltage +Vera. Thereby, the electrons are tunneled from the floating gate of the non-volatile storage cell to the substrate.

The erase operation may be performed for each of the programmable routing switches commonly connected with the control signal lines for the erase operation or may be collectively performed for the whole chip.

Next, the write operation will be described. The write operation is performed for each of a plurality of programmable routing switches 300-303 commonly connected to the control signal lines 316 or 317. Since, in the programmable routing switches 300-303, the non-volatile storage cells are arranged in multiple stages so as to configure the multiplexer-type switch as described with reference to FIG. 3, the operation is performed for each of the non-volatile storage cells in each stage.

In the write operation, by applying 0 V to the control signal lines 322 and 323 and setting the switch FETs 312-315 to the non-conducted status, the signal input terminals of the programmable routing switches 300-303 are set to the floating state.

The control signal lines 320 and 321 are applied with a signal for selecting the multiplexer circuits 308-311 to output 0 V. Thereby, all of the routing wires 326 and 327 are set to 0 V. Each of the control signal lines, e.g., the control signal lines 316, commonly connected with the programmable routing switches selected as a write target is applied with the write voltage +Vpgm or +Vpass, while the control signal line 318 is applied with the signal voltage to set the switch FETs 304 and 305 to the conducted status and the control signal lines 324 and 325 are applied with 0 V or the write inhibit voltage +Viht. Thereby, the write operation is performed for the selected non-volatile storage cells of the programmable routing switches 300-301.

The control signal lines, e.g., the control signal lines 317, commonly connected with the programmable routing switches 302-303 not selected as a write target are applied with 0 V, while the control signal line 319 is applied with 0 V so as to set the switch FETs 306 and 307 to the non-conducted status. Thereby, the propagation of 0 V or the write inhibit voltage +Viht applied to the control signal lines 324 and 325 to the signal output terminals of the programmable routing switches 302-303 not selected as a write target is inhibited, which prevents erroneous writing to the programmable routing switches 302-303 not selected as a write target.

Next, the verify read operation will be described. As with the write operation, the read operation is performed for each of the plurality of programmable routing switches commonly connected to the control signal lines 316 and 317, respectively. In the read operation, the control signal lines 320 and 321 are applied with the signal to select the multiplexer circuits 308-311 to output 0 V. Thereby, all of the routing wires 326 and 327 are set to 0 V.

The control signal lines, e.g., the control signal lines 316, commonly connected to the programmable routing switches selected for verify reading are applied with the voltage +Vpass or 0 V, as described with reference to FIG. 3, while the control signal line 318 is applied with the signal voltage so as to set the switch FETs 304 and 305 to the conducted status and the control signal lines 324 and 325 are applied with the read voltage +Vread.

In order to set 0 V for the signal input terminals of the programmable routing switches selected as a read target corresponding to the non-volatile storage cells selected for reading in the programmable routing switch selected for verify reading, an appropriate signal is input to the control signal lines 322 to sequentially set the switch FETs 312 and 313 to the conducted status. The control signal lines, e.g., the control signal lines 317, commonly connected with the programmable routing switches not selected as a read target are applied with 0 V, while the control signal line 319 is applied with 0 V so as to set the switch FETs 306 and 307 to the non-conducted status. Thereby, the propagation of the read voltage +Vread applied to the control signal lines 324 and 325 to the signal output terminals of the programmable routing switches 302 and 303 not selected as a read target is inhibited, which prevents erroneous reading of the programmable routing switches 302 and 303 not selected for reading.

Next, the operation of the programmable routing switch will be described. In order to set the programmable routing switch to the operating state, the control signal lines 316-319 are applied with 0 V. According to the positive threshold voltage +Vt and the negative threshold voltage -Vt written in the non-volatile storage cells in the programmable routing switches 300-303, the signal propagation path is set up from one of the plurality of signal input terminals to the signal output terminal and the switch FETs 304-307 are set to the non-conducted status. The control signal lines 324 and 325 are set to 0 V.

The control signal lines 322 and 323 are applied with the voltage to set the switch FETs 312-315 to the conducted status, and the signal input terminals of all of the programmable routing switches are connected to the routing wires 326 and 327. To the control signal lines 320 and 321, the control signal is input for the multiplexer circuits 308-311 to selectively output the output signal from the programmable routing switches 300-303.

In the reconfigurable integrated circuit according to the present invention, the programmable routing switch in the functional block 101 has the similar circuit configuration with that of the programmable routing switch in the switch matrix as described above. Accordingly, by operating in the similar manner with that of the switch matrix 102, the functional block 101 can also perform the erase, write, verify read, and programmable routing switch operations therein.

REFERENCE SYMBOLS

100: basic configuration of a reconfigurable integrated circuit
101: functional block
102: switch matrix
103: routing wires
104: control circuits
105: control signal lines
200-207: signal input terminals
208-214: control terminals
215: signal output terminal
216: non-volatile storage cells
217: programmable routing switch
300-303: programmable routing switches
304-307: switch FETs
308-311: multiplexer circuits
312-315: switch FETs
316-325: control signal lines
326,327: routing wires

The invention claimed is:
1. A non-volatile multiplexer-type programmable routing switch, comprising:
a plurality of input terminals;
a single output terminal;

a plurality of non-volatile storage cells having a structure of field effect transistor with a switch function, the non-volatile storage cells being arranged in multiple stages to form a binary tree structure, each stage including at least a pair of non-volatile storage cells, in a propagation path of signal voltage from the input terminals to the output terminal, so that the signal voltage from the input terminals is selectively propagated to the output terminal;

a first and second control terminal arranged in each stage, the first control terminal being connected to each control gate of one of the pair of the non-volatile storage cells, the second control terminal being connected to each control gate of the other of the pair of the non-volatile storage cells;

a third control terminal connected to substrate domains of all of the non-volatile storage cells;

control signal lines for controlling the non-volatile storage cells, and a control circuit to perform a write operation to store connection information to set the non-volatile storage cells to a conducted or non-conducted status, an erase operation to erase the connection information, and a read operation to verify the conducted or non-conducted status of the non-volatile storage cells directly for the non-volatile storage cells, wherein the erase operation is collectively performed for all of the non-volatile storage cells by applying an erase voltage to the third control terminal.

2. A semiconductor integrated circuit using the non-volatile multiplexer-type programmable routing switch according to claim 1, comprising:

a plurality of basic tiles as basic circuit elements arranged in arrays, each basic tile being connected by routing wires and including a switch matrix and a functional block connected to the switch matrix by the routing wires;

wherein the non-volatile multiplexer-type programmable routing switch is arranged in the switch matrix.

3. A semiconductor integrated circuit using the non-volatile multiplexer-type programmable routing switch according to claim 1, comprising:

a plurality of basic tiles as basic circuit elements arranged in arrays, each basic tile being connected by routing wires and including a switch matrix and a functional block connected to the switch matrix by the routing wires; and wherein the non-volatile multiplexer-type programmable routing switch is arranged in the functional block.

* * * * *